United States Patent
Gustafsson et al.

(10) Patent No.: US 9,032,611 B2
(45) Date of Patent: May 19, 2015

(54) APPARATUS FOR GENERATING PATTERNS ON WORKPIECES

(75) Inventors: Per-Erik Gustafsson, Solna (SE); Mikael Wahlsten, Stockholm (SE)

(73) Assignee: Mycronic AB, Taby (SE)

( * ) Notice: Subject to any disclaimer, the term of this patent is extended or adjusted under 35 U.S.C. 154(b) by 472 days.

(21) Appl. No.: 13/233,649

(22) Filed: Sep. 15, 2011

(65) Prior Publication Data

US 2012/0066898 A1    Mar. 22, 2012

Related U.S. Application Data

(60) Provisional application No. 61/383,317, filed on Sep. 15, 2010.

(51) Int. Cl.

| H05K 13/04 | (2006.01) |
|---|---|
| H05K 13/08 | (2006.01) |
| H01L 21/67 | (2006.01) |
| H01L 21/68 | (2006.01) |
| H01L 21/683 | (2006.01) |

(52) U.S. Cl.
CPC ............ *H05K 13/0404* (2013.01); *H05K 13/08* (2013.01); *H05K 2203/0528* (2013.01); *H01L 21/67132* (2013.01); *H01L 21/67144* (2013.01); *H01L 21/681* (2013.01); *H01L 21/6838* (2013.01); *H05K 13/0413* (2013.01)

(58) Field of Classification Search
CPC .......... H05K 13/0413; H05K 13/0408; H05K 3/4379; H05K 3/0002; H05K 3/0082; H05K 2201/09918; H05K 13/0404; H05K 2203/166; H05K 13/08; H05K 2203/0528
USPC .................... 29/739, 740, 741, 743
See application file for complete search history.

(56) References Cited

U.S. PATENT DOCUMENTS

| 5,894,657 | A | 4/1999 | Kanayama et al. |
|---|---|---|---|
| 6,165,658 | A * | 12/2000 | Taff et al. ................ 430/30 |
| 6,317,972 | B1 * | 11/2001 | Asai et al. ................ 29/833 |
| 8,372,666 | B2 * | 2/2013 | Crawford et al. ........... 438/15 |
| 2002/0092595 | A1 | 7/2002 | Fogal et al. |
| 2003/0086600 | A1 | 5/2003 | Ganot et al. |
| 2004/0061346 | A1 | 4/2004 | Capewell |
| 2005/0213806 | A1 * | 9/2005 | Hanina et al. ............ 382/151 |
| 2011/0210104 | A1 | 9/2011 | Wahlsten et al. |
| 2011/0213479 | A1 | 9/2011 | Wahlsten et al. |
| 2011/0213484 | A1 | 9/2011 | Wahlsten et al. |
| 2011/0228242 | A1 | 9/2011 | Wahlsten et al. |
| 2011/0257777 | A1 | 10/2011 | Wahlsten et al. |

FOREIGN PATENT DOCUMENTS

WO    WO 2011/079956    7/2011

OTHER PUBLICATIONS

International Search Report and Written Opinion dated Mar. 8, 2012 issued in corresponding PCT Application No. PCT/IB2011/002150.

* cited by examiner

*Primary Examiner* — Livius R Cazan
(74) *Attorney, Agent, or Firm* — Harness, Dickey & Pierce, P.L.C.

(57) ABSTRACT

A pick-and-place tool configured to pick and place at least one die on a workpiece includes a mounting head. The mounting head includes a die position determining unit configured to one of measure and detect an actual position of at least one die during a time between the placement of the at least one die on the workpiece and the picking up of a subsequent die for placement on the workpiece.

14 Claims, 9 Drawing Sheets

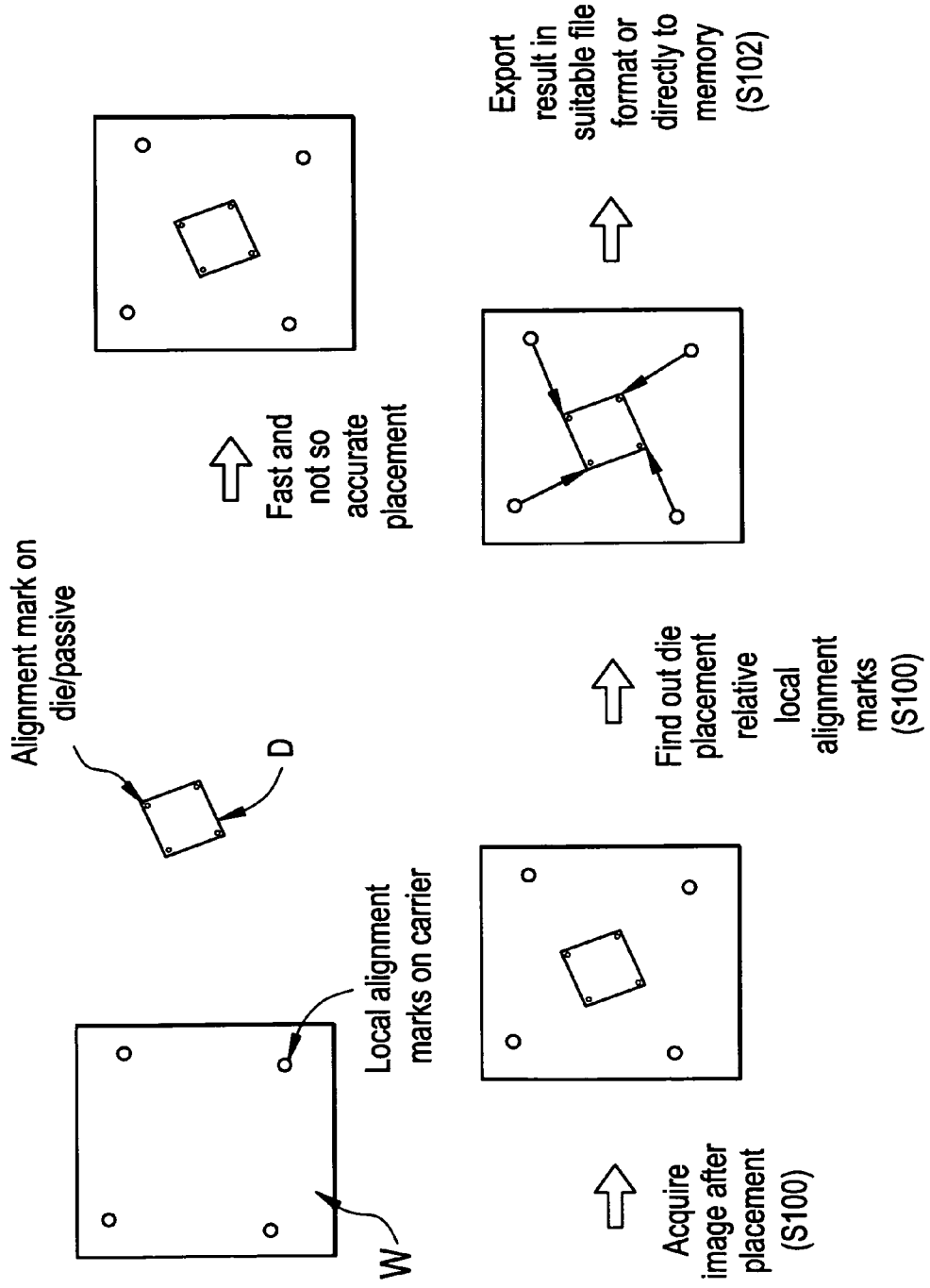

APPARATUS FOR GENERATING PATTERNS ON WORKPIECES

CROSS-REFERENCE TO RELATED APPLICATION(S)

This patent application claims the benefit of U.S. provisional application No. 61/383,317, filed on Sep. 15, 2010, the entire contents of which is incorporated herein by reference.

BACKGROUND

1. Field

Example embodiments relate to methods and apparatuses for performing pattern alignment to die, and methods and apparatuses for generating patterns on workpieces.

2. Description of Conventional Art

In the packaging and assembly industry, stacked structures are becoming more common. Often, however, it is relatively difficult to accurately match a structure on a subsequent layer with a structure on a previous layer.

One example of a process requiring relatively accurate matching of structures is the stacking of dies on top of each other where the second die must be aligned relatively accurately with the first die to create sufficient contact between the two dies.

Another example is a fan-out or embedded die process in which a first structure is composed of mounted dies, and a second structure is a conductor pattern or via hole pattern (e.g., a build up metal patterned with lithography or laser drilled via holes), which must be aligned accurately with the first structure (e.g., the pads on the dies).

Conventional pick-and-place machines are capable of determining the local alignment of dies on a workpiece, and then using the local alignment together with alignment fiducial(s) or other measurable features on the die to align the die in the correct position on the workpiece.

In a conventional process in which two or more dies are stacked on top of each other, a first layer of one or more dies is accurately placed with a relatively slow pick-and-place machine and the second layer of one or more dies is also placed with a relatively slow pick-and-place machine.

Conventionally, each die must be placed relatively accurately on a workpiece because conventional patterning equipment (e.g., aligners, steppers, etc.) have somewhat limited capabilities to individually align to each die without sacrificing (e.g., significantly sacrificing) throughput (e.g., TAKT). Thus, conventionally, patterning equipment sacrifices speed to achieve the necessary accuracy of the pick-and-place machine.

SUMMARY

At least one example embodiment provides a mounting head for a pick-and-place tool configured to pick and place at least one die on a workpiece. The mounting head includes: a die position determining unit configured to one of measure and detect an actual position of at least one die during a time between the placement of the at least one die on the workpiece and the picking up of a subsequent die for placement on the workpiece.

According to at least some example embodiments, the die position determining unit may be configured to one of measure and detect the actual position of the at least one die while the mounting head is still in a position for placing the at least one die on the workpiece. The pick-and-place tool may be configured to measure the actual position of the at least one die on the workpiece relative to at least one measurement mark.

According to at least some example embodiments, the at least one measurement mark may be a local alignment mark or another unique feature associated with or connected to a position on the workpiece. The pick-and-place tool may be configured to output position information indicative of the actual position of the at least one die, and the position information may include a measurement of the position of the at least one die relative to the local alignment mark or some other reference point to which the local alignment mark have a clearly defined distance.

The pick-and-place tool may be further configured to output position information indicative of the measured actual position to an external unit, either directly or indirectly via a memory, and the position information may be usable in adjusting original pattern data associated with a pattern to be generated on the workpiece.

The at least one die or component may be placed on a first layer, and a pattern generator may use the position information to adjust original pattern data to be written on a second layer, which is different from the first layer.

A pattern may be modified for several layers after the die or dies are placed on the workpiece. Both the first layer and the second layer may be layers associated with the same group of placed dies or components. For example, a subsequent second layer (e.g., a via hole layer) may be modified based on the position of one or more dies of the first layer, and then a subsequent third layer (e.g., circuit pattern layer) may be modified to fit the second layer (e.g., via hole layer), which is formed on the die or dies. In this case, the circuit pattern layer and the via hole layer are associated with the same group of dies.

According to at least some example embodiments, a common transformation may be associated with a group (or subset) of dies on the workpiece. This may be useful, for example, in cases where several dies are to be connected to the same printed circuit board (PCB), or some other connector board. In this example, the entire region in which the group of dies is placed is associated with the same transformation, which provides a relatively good fit for the whole region relative to, for example, the connector card or some other component that puts requirements on a common boundary condition.

The first layer may be a layer associated with a first group of placed dies or components and the second layer may be a layer associated with a second group of placed dies or components different from the first group of dies or components. This example embodiment may be used, for example, when different routing layers are used for different parts of a pattern; for example, when a first layer is used as a routing layer for a first group of dies, and a third layer is used as a routing layer for a second group of dies, etc.

According to at least some example embodiments, the die position determining unit may include a camera configured to obtain an image of the workpiece. The camera may further be configured to obtain an image covering only a subarea of the workpiece surface, wherein the image of the subarea is used to measure the actual position of at least one die placed on the workpiece relative to at least one measurement mark associated with the at least one die placed on the workpiece, wherein the at least one measurement mark is a local alignment mark or another unique feature associated with or connected to a position on the workpiece. The image obtained by the camera may cover only a subarea of the workpiece surface area and may further include actual position information for only a subset of the plurality of dies placed on the workpiece. In one embodiment, the subset of dies includes or equals the at least one die placed in the last pick-and-place action performed by the mounting head. The camera may be a charge coupled device camera.

According to at least some example embodiments, the die position determining unit may include a sensor configured to detect a position of the at least one die on the workpiece. The sensor may be a laser sensor configured to use at least one of reflected light and triangulation to detect the position of the at least one die on the workpiece.

BRIEF DESCRIPTION OF THE DRAWINGS

Example embodiments will become more apparent from the following description of the drawings in which:

FIG. 2 is a partial flow diagram for explaining the example embodiment illustrated by the flow chart shown in FIG. 1A;

DETAILED DESCRIPTION

Figure 1A:
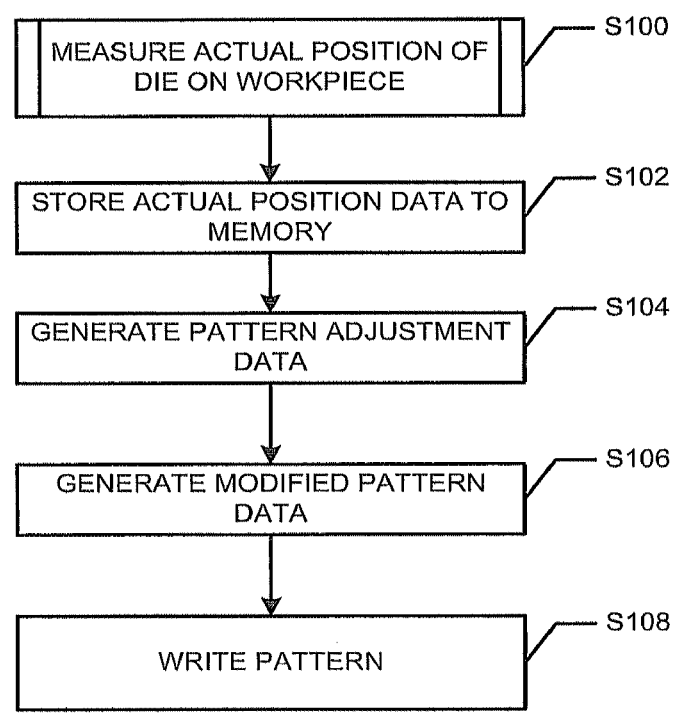
FIG. 1A is a flow chart illustrating a method for generating a pattern on a workpiece according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for the purposes of describing example embodiments. Example embodiments may be embodied in many alternate forms and should not be construed as limited to only the example embodiments set forth herein. Example embodiments are to cover all modifications, equivalents, and alternatives falling within the appropriate scope.

Although the terms first, second, etc. may be used herein to describe various elements, these elements should not be limited by these terms. These terms are only used to distinguish one element from another. For example, a first element could be termed a second element, and similarly, a second element could be tee a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular example embodiments only and is not intended to be limiting. As used herein, the singular forms "a," "an," and "the," are intended to include the plural forms as well, unless the context clearly indicates otherwise. The terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In some alternative implementations, the functions/acts noted may occur out of the order noted in the figures. For example, two figures shown in succession may in fact be executed substantially concurrently or may sometimes be executed in the reverse order, depending upon the functionality/acts involved.

Although a flow chart may describe the operations as a sequential process, at least some of the operations may be performed in parallel, concurrently or simultaneously. In addition, the order of the operations may be re-arranged. A process may be terminated when its operations are completed, but may also have additional steps not included in the figures. A process may correspond to a method, function, procedure, subroutine, subprogram, etc. When a process corresponds to a function, its termination may correspond to a return of the function to the calling function or the main function.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, at least some example embodiments are described with reference to acts and symbolic representations of operations (e.g., in the form of flow charts, flow diagrams, data flow diagrams, process flow diagrams, partial process flow diagrams, structure diagrams, block diagrams, etc.), at least some of which may be implemented as program modules or functional processes including routines, programs, objects, components, data structures, etc., that perform particular tasks or implement particular abstract data types. These program modules and/or functional processes may be implemented using existing hardware at existing pattern generators, pattern generating apparatuses, pick-and-place machines, die placement systems, combinations of these systems/apparatuses or the like. Such existing hardware may include one or more central processing units (CPUs), digital signal processors (DSPs), application-specific-integrated-circuits (ASICs), field programmable gate arrays (FPGAs) computers or the like in addition to pattern generating equipment, such as laser direct imaging (LDI) writers and/or other pattern generating equipment. A pattern generation system according to an example embodiment will be discussed in more detail below.

As disclosed herein, the term in "storage medium" or "computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, one or more example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks.

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Example embodiments relate to methods and apparatuses for performing pattern alignment to die, and methods and apparatuses for writing an image on a workpiece. An image may be written on a workpiece using a laser direct imaging (LDI) device to pattern a surface of the workpiece. Patterning by projecting, writing or printing a pattern on a surface of a workpiece may include exposing a photoresist or other photosensitive material, annealing by optical heating, ablating, creating any other change to the surface by an optical beam, etc.

At least one example embodiment relates to laser pattern imaging of workpieces during the manufacture of products, such as printed circuit boards (PCBs), substrates, flexible roll substrates, flexible displays, wafer level packages (WLP), flexible electronics, solar panels, displays, etc.

Wafer level packaging (WLP) is a technology in which an integrated circuit is packaged at the wafer level. WLP is essentially a true chip scale package (CSP) technology because the resulting package is practically of the same size as the die. WLP has the ability to enable true integration of wafer fabrication, packaging, test, and burn-in at wafer level in order to streamline the manufacturing process for a device from silicon start to customer shipment.

Wafer-level packaging basically includes extending the wafer fabrication processes to include device interconnection and device protection processes. In most other types of packaging, wafer dicing is performed first, and then the individual dies are put in a plastic package and solder bumps are attached. Wafer-level packaging involves performing wafer dicing after attaching the top and bottom outer layers of packaging as well as the solder bumps to the integrated circuit while still in the wafer.

For solar panel manufacturing, a similar pick and place tool and method to the one described in this disclosure may be used. The pick-and-place tool used in solar panel manufacturing may be configured to first place components, such as e.g. optical elements, on a first layer and place other components, such as e.g. solar cells, on a second layer different from the first layer. In example embodiments, the method includes patterning or ablating a layer surface, e.g. a layer surface associated with the placed dies/components, with modified pattern or write data after receiving placement position information from a camera or sensor arranged on the mounting head of the pick-and-place tool performing the placement of components.

As discussed herein, the term workpiece is used to denote any carrier of a surface layer upon which a pattern may be printed with a laser direct (or other) imaging (or pattern generation) system. For example, a workpiece may be a silicon substrate or a silicon wafer for a printed circuit board, an organic substrate, etc. Workpieces may have any shape (e.g., circular, rectangular, polygonal, etc.) and may have any size for example in a piece or in a roll.

The term die is used to denote a passive component, an active component, or any other component associated with electronics. For example, a die may be a small block of semiconducting material, on which a given functional circuit may be fabricated.

The term in local alignment is used to denote alignment in relation to alignment features on an individual die or on a group of dies. An alignment feature may be a measurement mark, such as a local alignment mark, edge, corner, bump, pad, contact, text or other measurable feature of the die that provides a registration measure with relatively significant accuracy.

As discussed herein, the term global alignment denotes alignment in relation to alignment features on a workpiece. In this case, an alignment feature may be a measurement mark, such as a global alignment mark, edge, corner, bump, pad, contact, text or other measurable feature of the workpiece that provides a registration measure with relatively significant accuracy.

According to example embodiments, reading and writing are to be understood in a broad sense. Reading operations may include, for example, microscopy, inspection, metrology, spectroscopy, interferometry, scatterometry, etc. of relatively small or relatively large workpieces. As mentioned above, writing may include exposing a photoresist or other photosensitive material, annealing by optical heating, ablating, creating any other change to the surface by an optical beam, etc.

In an embedded die and/or fan-out process, it is relatively important to accurately align an electronic pattern in order to write patterns on dies placed with certain accuracy on a workpiece. The conventional state of the art method in the industry is to use a rather slow, but accurate, pick and place tool, which affects the process speed. Another way is to use a fast pick and place tool and measure the positions of the placed components. This measurement may be done in an off-line measurement system after all dies have been placed, and often includes measuring one or more reference features on the die and the workpiece, or may be done immediately after all of the dies have been placed.

According to at least some example embodiments, the mounting head in a pick-and-place unit measures the actual positions of the dies by obtaining an image (e.g., taking a picture), or detecting, immediately after each placement action performed by one or a plurality of pick-and-place nozzles of the mounting head. Hence, the mounting head of the pick-and-place unit may include a measuring head of a camera and/or a detection unit (e.g., a sensor), which does not use images to detect positions. The camera may be a charge coupled device (CCD) camera or other imaging device suitable for obtaining an image of the workpiece. The sensor may be a laser sensor using reflected light and/or triangulation to detect the positions of the dies on the workpiece. As discussed herein, the measuring head and the detection unit may be referred to collectively as a die position determining unit.

By measuring the actual placement of the one or more dies immediately after placement, the measurement (or detection) head is always in the correct position for measuring placement of the one or more dies.

According to at least some example embodiments, the measured actual position data of a first layer of dies on the workpiece, or pattern adjustment data based at least partially on the measured actual positions of the dies, is transmitted from the pick-and-place unit (e.g., via a memory) to a pattern generator (e.g., a LDI tool). The pattern generator uses the transmitted data as an input adjustment. For example, the pattern generator may re-sample pattern data to be used by the pattern generator for patterning a subsequent layer on the workpiece.

According to at least one example embodiment, an actual position of a die placed on a workpiece is measured by a pick-and-place unit, and measured position data indicative of the measured actual position is output from the pick-and-place unit to a memory. A pattern generator obtains the measured position data from the memory to prepare for a subsequent patterning step in which a pattern is written on a surface of the workpiece based on the data received from the pick-and-place unit.

The measured position data may also be referred to herein as measured position information, actual position data, actual position information, measured actual position data, etc.

In one example, the pattern generator generates pattern adjustment data based on the measured position data obtained from a memory, and then modifies and/or adjusts the pattern data based on the pattern adjustment data. In one example, the pattern adjustment data may be a re-calculated or transformed position of the die on the workpiece. In this example, the re-calculated or transformed position of the die is the actual measured position of the die in the global coordinate system of the laser pattern generator, rather than the local coordinate system. The pattern generator uses the pattern adjustment data to relax position accuracy of the pick-and-place machine, such as a surface mount technology (SMT) machine.

As is known, SMT is a method for constructing electronic circuits in which the components (e.g., surface mounted components (SMC)) are mounted directly onto the surface of printed circuit boards (PCBs). An electronic device so made is referred to as a surface mount device (SMD).

One principal example of a conventional prior art SMT machine comprises a pick-and-place unit with a mounting head, a machine frame, a component feeding device, including a plurality of component feeders, and arranged at a component feeder area of the machine frame, e.g. a gantry system having a first beam, or X beam, and a second perpendicular beam, or Y beam, attached to the machine frame, where the mounting head may be movably attached to the X beam, and a board transportation system, attached to the machine frame. The component feeding device is configured to present electronic components to the mounting head. A gantry system may be used to move the mounting head between the component feeding device and the workpiece. The board transportation system transports workpieces between a conveyor line and a working area of the SMT machine. According to at least one example embodiment, the SMT machine may be a component mounting machine as described in PCT Publication No. WO 2011/079956 (A1), the entire contents of which are incorporated herein by reference.

The mounting head may be movable in the vertical direction, and may also be configured to rotate around a vertical axis. The mounting head may also contain a suction device in form of at least one nozzle. The suction device, or at least one nozzle, makes it possible to pick up, by activating the suction device, electronic components (or dies) from the component feeding device, transport them to the substrate, and release them at a precise location on the workpiece. According to at least one example embodiment, the mounting head may be a mounting head as described in PCT Publication No. WO2011/079956 (A1) but further adapted to have at least one camera, or sensor, arranged on the mounting head, and which is configured to measure, or detect, the actual position of at least one die placed on a workpiece.

According to at least some example embodiments, the pick-and-place action of one or a plurality of dies is performed by one or more of the plurality of nozzles of the mounting head, i.e. the placement of at least one die is performed by one or more of the plurality of nozzles. In order to speed up the process, the measuring or detection of the actual position of at least one die may be performed immediately after the at least one die is placed by the at least one nozzles on the workpiece, and before initiating a subsequent pick-and-place action by the mounting head.

Because the actual position of the die on the workpiece is measured by the pick-and-place unit after (e.g., immediately after) placing the die on the workpiece, a separate metrology tool for performing the measurement is not necessary. The measured actual position of the die or pattern adjustment data generated based on the actual position of the die may be sent from the pick-and-place machine to the pattern generator, either directly or indirectly via a memory, for use in adjusting the original pattern data associated with the pattern to be generated on the workpiece.

Figure 3A:
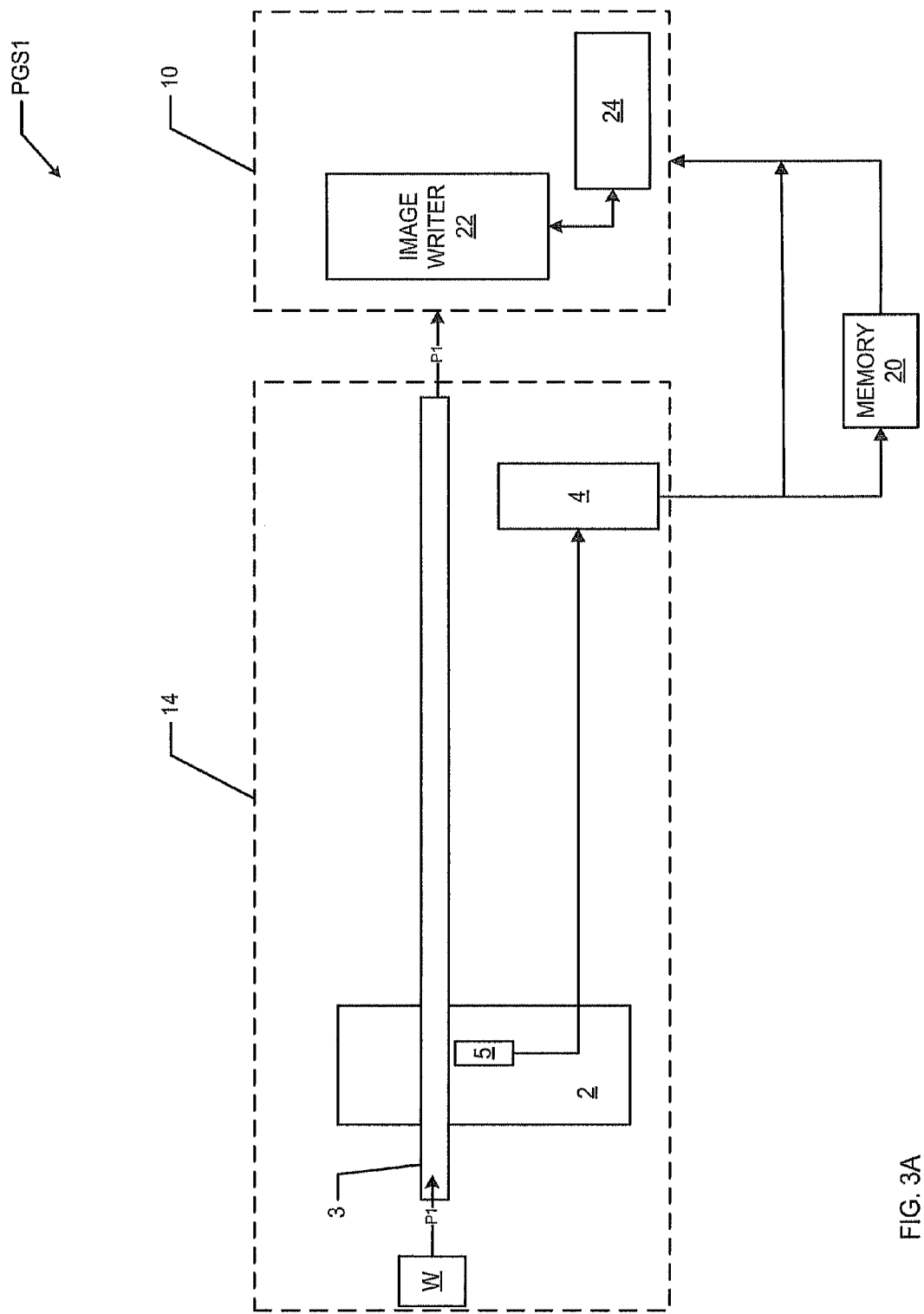
FIG. 3A illustrates a pattern generation system according to an example embodiment.

FIG. 3A is a plan view illustrating a pattern generation system according to an example embodiment.

Referring to FIG. 3A, the pattern generation system PGS1 includes a die placement system 14 and a pattern generator 10. The die placement system 14 may also be referred to as a pick-and-place tool.

The die placement system 14 includes a pick-and-place unit 2 for picking and placing one or more dies on a surface of a workpiece W. Although FIG. 3A shows only a single pick-and-place unit 2, example embodiments may include any suitable number of pick-and-place units 2 arranged side-by-side in the direction P1. Moreover, although some example embodiments may be discussed with regard to placement of a single die on a workpiece, it will be understood that any number of dies may be placed on any number of workpieces in the same or a similar manner.

Still referring to FIG. 3A, the workpiece W to be provided with the dies is transported through the die placement system 14 in the direction P1 by a transport system 3. Because transport systems such as the transport system 3 are generally known, a detailed discussion is omitted.

Still referring to FIG. 3A, the pick-and-place unit 2 includes a camera 5. The camera 5 is configured to obtain images of the workpiece W on which the die or dies are placed by the pick-and-place unit 2. The camera 5 may be a charge coupled device (CCD) camera or other imaging device capable of obtaining images of the die, or dies, on the workpiece W.

In the example embodiment shown in FIG. 3A, the measurement or detection is performed within the pick-and-place unit 2. A measurement or detection system (e.g., camera 5 or sensor) is arranged on a mounting head of the pick-and-place unit 2. Accordingly, the measuring (or detection) of the actual positions of each die is fully integrated in the pick-and-placement of the die, and may be performed immediately after the die is placed on the workpiece, rather than after all dies have been placed.

In addition to a camera and/or a sensor, the mounting head may include image processing and/or detection hardware (e.g., a position measurement controller 4). The position measurement controller 4 will be discussed in more detail below.

In one example, an actual position of at least one die on the workpiece may be determined during a time between the placement of the at least one die on the workpiece and the picking up of a subsequent die for placement on the workpiece. For example, the actual position of the at least one die may be determined while the mounting head is still in a position for placing the at least one die on the workpiece.

According to at least some example embodiments, the mounting head may include one or more nozzles for placing one or more dies on the workpiece, but only a single camera or detection unit for measuring the actual positions of the one or more dies placed on the workpiece (e.g., a first layer of the workpiece). As discussed in more detail later, the measured position data is sent to a pattern generator that adjusts pattern data for a subsequent second layer based on the measured actual positions of the dies through re-sampling. The re-sampled pattern data is then used to write a pattern on a subsequent layer of the workpiece.

Still referring to FIG. 3A, the die placement system 14 includes a position measurement controller 4 configured to communicate with the camera 5. The position measurement controller 4 may be a computer or other suitable processing system or controller. In one example, the position measurement controller 4 may also include image recognition software configured to recognize objects such as dies or features such as alignment marks on the dies (e.g., local alignment marks) and/or the workpiece W (e.g., global alignment marks).

In the example embodiment shown in FIG. 3A, the position measurement controller 4 is coupled to a memory 20 and the pattern generator 10. The memory 20 may be any non-volatile memory capable of storing image data and/or position information associated with the die placed on the workpiece W by the pick-and-place machine 2.

The pattern generator 10 is also coupled to the memory 20 and the position measurement controller 4. The pattern generator 10 is configured to receive measured position data indicative of the actual position of the die, or plurality of dies, on the workpiece W from the position measurement controller 4 either directly or indirectly via the memory 20.

The pattern generator 10 includes an image writer 22 and an image write controller 24. The image writer 22 and the image write controller 24 are configured to exchange data with one another, and the image write controller 24 is configured to control the image writer 22.

The image writer 22 may be any conventional pattern generator or other writing tool capable of generating a pattern on a workpiece.

In one example, the image writer 22 may be a photoplotter. A photoplotter is an electro-mechanical-optical machine that exposes a latent image on a media, such as high-contrast monochromatic (black-and-white) photographic film, using a light source under computer control. Once the exposing step is complete, the media is processed in a film processor using a developer solution, along with fixing, washing, and drying.

A photoplotter may be used to form nearly any conceivable image, but photoplotters are generally used for the production of printed circuit boards (PCBs) and integrated circuit (IC) packages. Other application areas include chemical milling and specialized graphic arts. Photoplotting is a first step of making photolithography masks for PCBs. In the PCB industry, these masks are called photo plots and are generally limited to features of about 20 μm or more. ICs are made in a similar fashion utilizing photomasks with sub-micrometer feature sizes; photomasks are traditionally made by photoreducing photo plotter output.

More modern photoplotters are generally raster-scan devices that use a laser beam focused to one or more spots, and modulated at multi-megahertz rates, to form the image. Initially, green argon-ion lasers and blue helium-cadmium lasers were used. More recent models utilize a red helium-neon laser, red laser diodes or even red light emitting diodes (LEDs).

Photo plotters are closely related to image setters, but differ in the type of controller used to produce the image, and in the resolution and absolute accuracy of the image. Generally, photo plotters meet more stringent specifications than image setters.

A recent development related to photo plotting is laser direct imaging (LDI), such as direct writing (no mask) or patterning of a workpiece. LDI utilizes a high-power laser to directly expose photoresist on a coated substrate instead of exposing photographic film, which eliminates the handling of photographic film. An example of a LDI machine or laser direct writer is described in U.S. Patent Application Publication No. 2003/0086600. In such a laser direct writer, a laser beam is scanned over a photosensitive surface layer of a workpiece to expose the layer with a pattern in accordance with pattern image data. The pattern image data may be provided from an external source, such as a computer or other image pattern generating device. According to at least one example embodiment, the image writer 22 may be an LDI machine or laser direct writer as described in U.S. Patent Application Publication No. 2003/0086600, the entire contents of which are incorporated herein by reference.

More generally, according to at least some example embodiments, the image writer 22 may include patterning equipment for patterning by projecting, writing or printing a pattern on a surface that may include exposing a photoresist or other photosensitive material, annealing by optical heating, ablating, creating any other change to the surface by an optical beam, etc.

Still referring to FIG. 3A, the image write controller 24 may be a computer or other processing device configured to control patterning (e.g., laser beam scanning) by the image writer 22 based on pattern image data and the actual position information for the one or more dies in the memory 20.

In one example, the image write controller 24 generates adjusted pattern image data by adjusting original pattern image data associated with a pattern to be written on the workpiece W based on the actual position information stored in the memory 20. The image writer 22 then writes the pattern on the workpiece W according to the adjusted pattern image data.

Figure 3B:
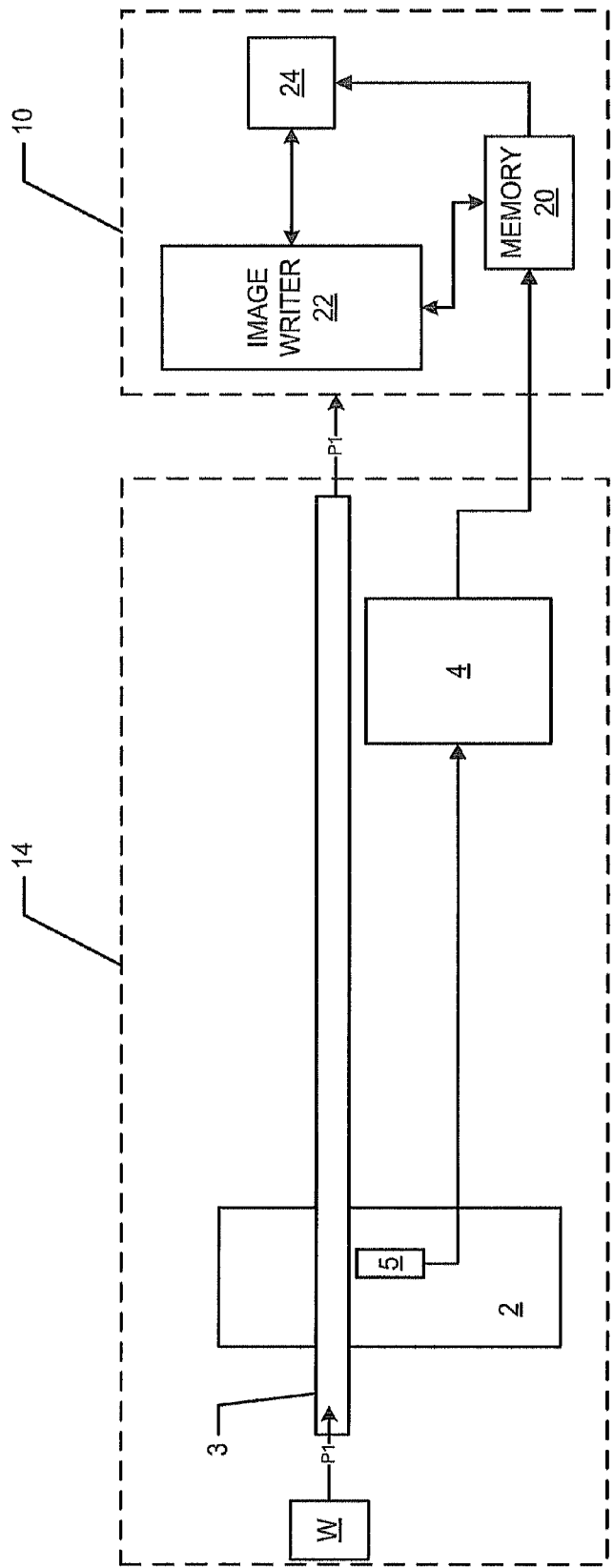
FIG. 3B illustrates a pattern generation system according to yet another example embodiment.

FIG. 3B illustrates a pattern generation system according to another example embodiment. The example embodiment shown in FIG. 3B is similar to the example embodiment shown in FIG. 3A, except that the memory 20 is included within the pattern generator 10. Other components of the system shown in FIG. 3B are the same as those in FIG. 3A.

Figure 3C:
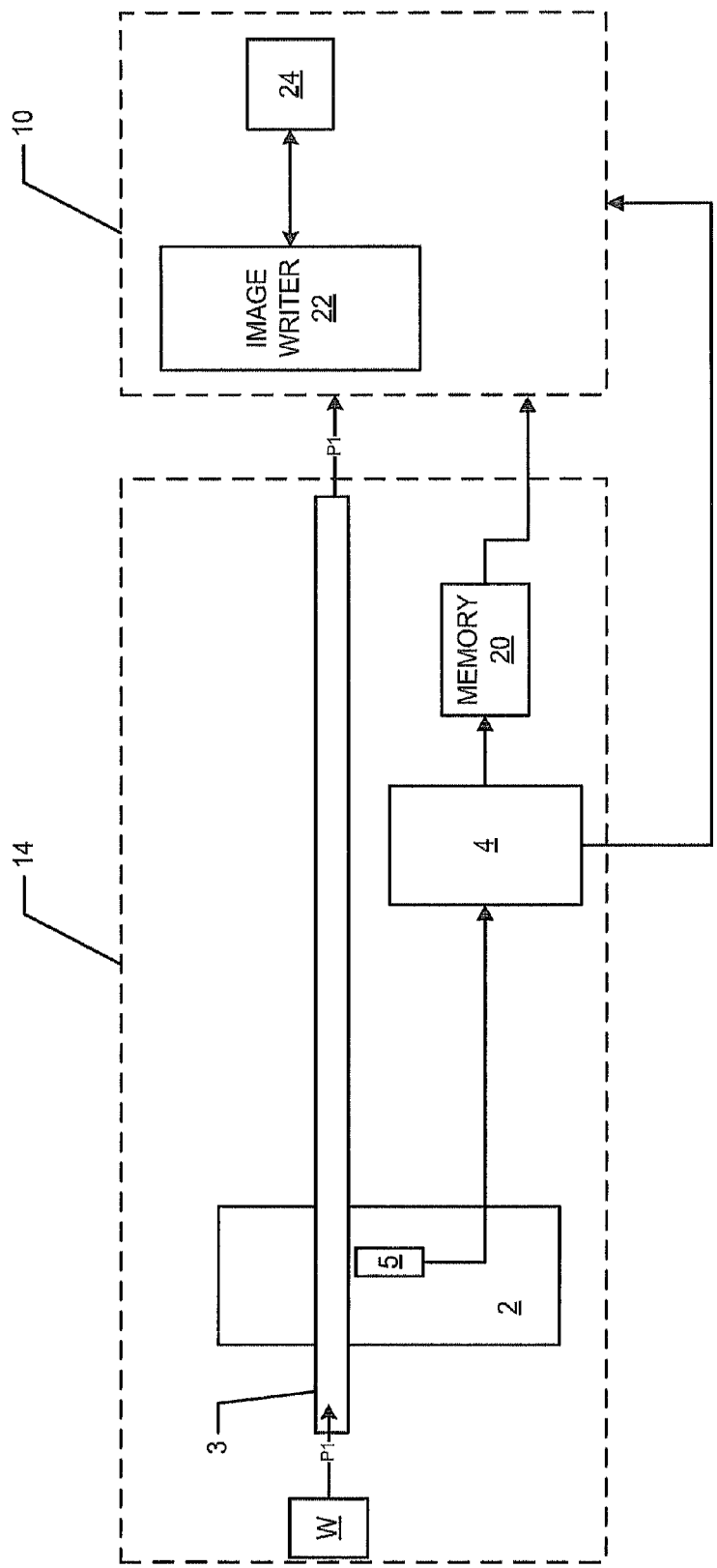
FIG. 3C illustrates a pattern generation system according to still another example embodiment.

FIG. 3C illustrates a pattern generation system according to still another example embodiment. The example embodiment shown in FIG. 3C is similar to the example embodiment shown in FIG. 3A, except that the memory 20 is included within the die placement system 14. Other components of the system shown in FIG. 3C are the same as those in FIG. 3A.

In example operation of the systems shown in FIGS. 3A through 3C, dies are placed on the workpiece W by the pick-and-place unit 2, the workpiece W is passed to the image writer 22 by the transport system 3, and the image writer 22 generates a pattern on the workpiece W. Example operation of the pattern generation system shown in FIG. 3A is discussed in more detail below with regard to FIGS. 1A through 2, 4 and 5. Although not discussed in detail, each of the systems shown in FIGS. 3B and 3C will be understood to operate in the same or substantially the same manner.

Figure 1B:
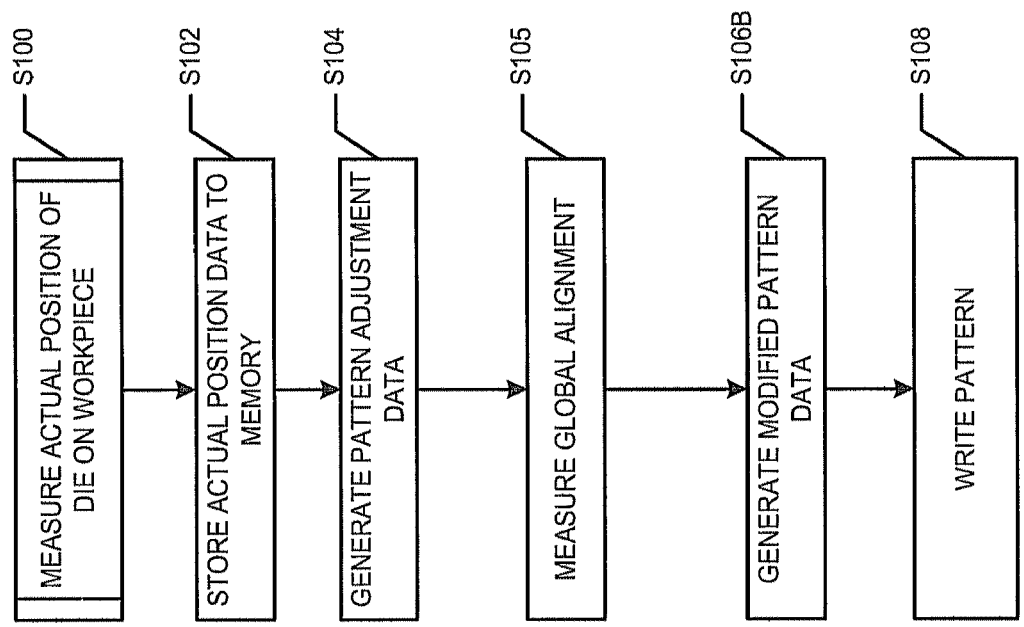
FIG. 1B is a flow chart illustrating a method for generating a pattern on a workpiece according to another example embodiment.
Figure 1C:
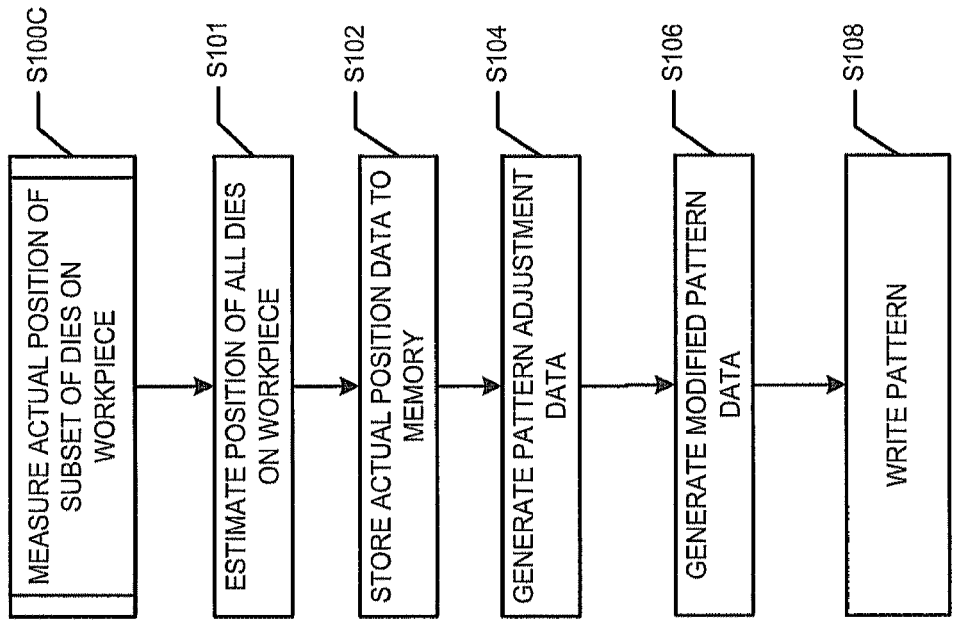
FIG. 1C is a flow chart illustrating a method for generating a pattern on a workpiece according to still another example embodiment.

FIGS. 1A through 1C are flow charts illustrating example embodiments of methods for generating patterns on workpieces.

In more detail, FIG. 1A is a flow chart illustrating method for generating a pattern on a workpiece according to an example embodiment. FIG. 2 is a partial process flow diagram for explaining the example embodiment illustrated by the flow chart shown in FIG. 1A.

Referring to FIGS. 1A and 2, at S100, after the pick-and-place machine 2 places a die D on the workpiece W, the die placement system 14 measures the actual local alignment position of the die D on the workpiece W. In this case, the die placement system 14 measures the actual position of the die D on the workpiece W relative to at least one measurement mark. The at least one measurement mark may be a local alignment mark or another unique feature associated with, or connected to, a position on the workpiece W. In a more specific example, the at least one measurement mark may be, for example, a correlation of, or reference to, graining, particles or other reference. As discussed above, the at least one measurement mark may be one or more local alignment marks, edges, corners, bumps, pads, contacts, text or other measurable feature that provides a registration measure with relatively significant accuracy.

In one example, the die placement system 14 measures (or detects) an actual position of at least one die D during a time between the placement of the at least one die on the workpiece W and the picking up of a subsequent die D for placement on the workpiece W.

In another example, the die placement system 14 determines the actual position of the at least one die while the mounting head is still in a position for placing the at least one die D on the workpiece W.

Figure 4:
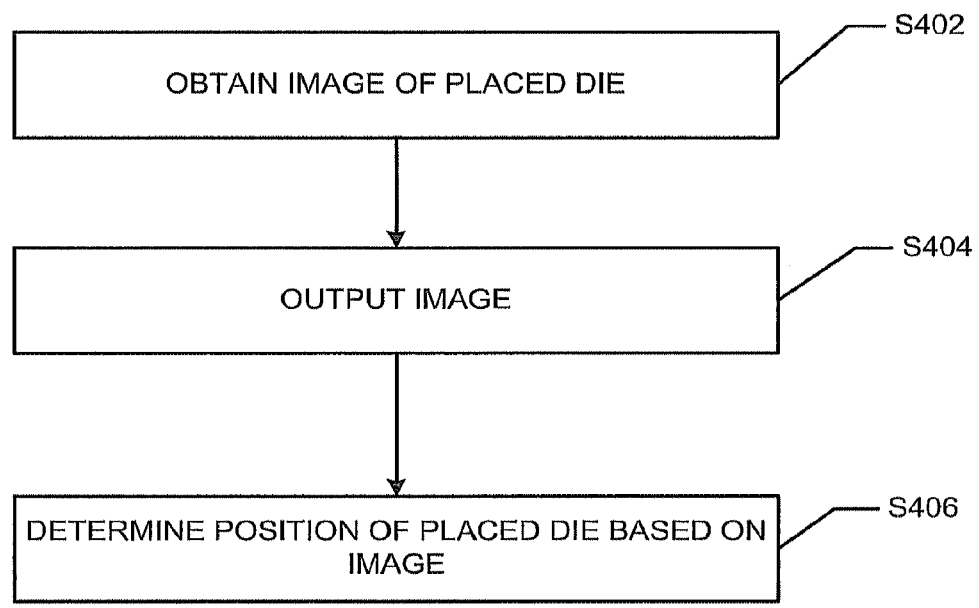
FIG. 4 is a flow chart illustrating an example embodiment of S100 in FIG. 1A.

FIG. 4 is a flow chart illustrating an example embodiment of a method for measuring the actual position of the die D on the workpiece W at S100 in FIG. 1A.

Referring to FIG. 4, at S402 the camera 5 obtains an image of the die D directly or immediately after the die D is placed on the workpiece W.

At S404, the camera 5 outputs the obtained image to the position measurement controller 4.

At S406, the position measurement controller 4 performs image processing to determine the actual position of the die D on the workpiece W in real time. As mentioned above, the actual position determined by the position measurement controller 4 is a local alignment position of the die D on the workpiece W relative to the carrier.

According to at least some example embodiments, the image processing performed by the position management controller 4 is generally based upon finding edges of the die, and then calculating a position for the die based on the position of the edges and knowledge about the shape of the die. Other techniques use a correlation and search for templates in the image using a correlation to find the position, rotation, etc. Still other techniques use model based shape matching, which searches for certain features in the image. Combinations of the above-described techniques may also be used. For example, a correlation may be first used to roughly find the object, and then a thresholding technique may be used to generate edges on a limited area in the image. Other well-known image processing techniques may also be used.

Still referring to FIG. 4, in an alternative example embodiment, at S404, the camera 5 exports the image to an external computer system (not shown). In this example, the external computer system then performs the above-described image processing to determine the actual position of the die D on the workpiece W at S406.

In still another example, at S404 the position measurement controller 4 estimates the actual position of the die D on the workpiece W based on a measurement of the die D, the at least one measurement mark before being placed on the workpiece W, and an estimate of a known offset.

For example, if the system has a deterministic offset from the ideal position after placement that is dependent on the measured position before the placement, then the deterministic offset may be added to the measured position. The offset may also be tracked over the area. For example, if an SMT machine places one die, and then measures the offset, then the SMT machine may use the same or substantially the same offset for the next die. This offset may be based on an average of a plurality of measurements. Thus, if the SMT machine is rather deterministic, then only a few dies need be measured after placement to obtain a sufficiently accurate estimated position of all dies using the known offsets.

Although each of the above-discussed alternative embodiments is possible, example embodiments will be described with regard to the actual position of the die being determined at the position measurement controller 4.

Returning to FIG. 1A, at S102, the position measurement controller 4 outputs the position data associated with the die D to the memory 20 at which the position data is stored. In one example, the position information output from the die placement machine 14 includes a measurement of the position of the die relative to the local alignment mark(s) or some other reference point to which the local alignment mark(s) have a clearly defined distance.

Although discussed herein as being output to the memory 20, the position measurement controller 4 may output the position information directly to the image write controller 24.

At S104, the image write controller 24 obtains (reads) the actual position data from the memory 20, and generates pattern adjustment data based on the obtained actual position data.

In one example, the image write controller 24 converts/transforms the actual position of the die D to the coordinate system of the pattern generator 10. In this case, the coordinate system of the pattern generator 10 is the global coordinate system, and the transformed position of the die D is a global alignment position relative to global alignment marks of the workpiece W, rather than a local alignment position relative to the local alignment marks.

Usually, a few global alignment marks are measured on the workpiece in a pattern generator such as a LDI machine. By doing so, the position of the workpiece may be determined in the global coordinate system of the pattern generator. The local measured positions/orientations of dies may then be transformed to positions in the global coordinate system of the pattern generator by using the well defined relationship between the positions of the global alignment marks relative the local alignment marks on the workpiece.

Returning to FIG. 1A, at S106 the image write controller 24 generates modified pattern data based on the pattern adjustment data. For example, the image write controller 24 may generate the modified pattern data by re-sampling the pattern data for the pattern to be written based on the pattern adjustment data to fit the measured position of the die D on the workpiece W. More detailed examples of methods for re-sampling pattern image data are described, for example, in one or more of U.S. patent application Ser Nos. 12/929,973, 12/929,975, 12/929,976, 12/929,977, and 12/929,981, all of which were filed on Feb. 28, 2011, the entire contents of each of which are incorporated herein by reference.

At S108, the image writer 22 then writes/generates a pattern on the workpiece W according to the modified pattern data. Examples of methods for generating a pattern on the workpiece W are described, for example, in one or more of U.S. patent application Ser. Nos. 12/929,973, 12/929,975, 12/929,976, 12/929,977, and 12/929,981.

By utilizing the example embodiment shown in FIG. 1A, features provided in a subsequent patterning step may be more accurately aligned with the one or more dies placed on the workpiece W by the pick-and-place unit 2.

As mentioned above, FIG. 1B is a flow chart illustrating a method for generating a pattern on a workpiece according to another example embodiment. As discussed in more detail below, the example embodiment shown in FIG. 1B is similar to the example embodiment shown in FIG. 1A, except that the die placement system 14 also measures positions of global alignment marks on the workpiece, and then the image write controller 24 generates the modified pattern data based on the pattern adjustment data and the measured positions of the global alignment marks.

In more detail with regard to FIG. 1B, each of S100, S102 and S104 are the same as discussed above with regard to FIG. 1A.

At S105, the die placement system 14 measures the global alignment of the workpiece W. In one example, the die placement system 14 measures actual positions of at least two global alignment marks on the workpiece W. The die placement system 14 may measure the actual positions of the global alignment marks in the same or substantially the same manner as the actual position of the die is measured at S100.

At S106B, the image write controller 24 generates modified pattern data based on the pattern adjustment data (generated at S104) and the measured positions of the global alignment marks on the workpiece W. For example, the image write controller 24 may generate the modified pattern data by re-sampling the pattern data based on the pattern adjustment data and the measured positions of the global alignment marks on the workpiece W to fit the measured position of the die D on the workpiece W. The re-sampling performed at S106B is the same or substantially the same as the re-sampling discussed above with regard to S106 in FIG. 1A.

At S108, the image writer 22 writes/generates a pattern on the workpiece W according to the modified pattern data in the same manner as discussed above with regard to S108 in FIG. 1A.

As with FIG. 1A, the example embodiment shown in FIG. 1B enables features provided in a subsequent patterning step to be more accurately aligned with the one or more dies placed on the workpiece W by the pick-and-place unit 2.

As also mentioned above, FIG. 1C is a flow chart illustrating method for generating a pattern on a workpiece according to still another example embodiment.

The example embodiment shown in FIG. 1C is described with regard to a situation in which a plurality of dies D are placed on the workpiece W by the pick-and-place unit 2.

Referring to FIG. 1C, after the plurality of dies D are placed on the workpiece W by the pick-and-place unit 2, at S100C the die placement system 14 measures the actual local alignment position of a subset (e.g., a cluster, such as 2×2 or 4×4) of the plurality of dies D on the workpiece W. In this example, the die placement system 14 measures the actual local alignment position of only a portion of the dies D on the workpiece W.

At S101, the die placement system 14 then estimates positions of all of the plurality of dies D on the workpiece W based on the measured actual local alignment positions of the subset of the plurality of dies D on the workpiece W.

In one example, the positions of the dies D on the workpiece W are estimated using a last (or most recent) measured offset. In another example, the last measured offset is combined with (e.g., summed with) a trend value dependent on the time and/or distance to the last measured offset. In yet another example, the offset for all dies D on a carrier W is measured, and the measured information is used to build a model/map of how the placement error varies as function of time and/or placement on the carrier W. In still another example, some points may be sampled in time and space, and then calculated and estimated measurement values for components in-between may be added using interpolation.

Still referring to FIG. 1C, each of the operations S104, S105, S106 and S108 are performed in the same or substantially the same as discussed above with regard to FIG. 1A, except that the image write controller 24 generates the pattern adjustment data at S104 based on the estimated die positions, rather than actual measured positions of the dies on the workpiece W.

As with FIGS. 1A and 1B, the example embodiment shown in FIG. 1C enables features provided in a subsequent patterning step to be more accurately aligned with dies placed on the workpiece W by the pick-and-place unit 2.

According to at least some example embodiments, the recalculated position of the die D on the workpiece W may be used by the die placement system 14 to match subsequent layers of dies to dies of the first layer. By using the re-calculated positions of the die on the workpiece W, subsequent layers of dies may be placed more accurately matched with the previous layer of dies.

At least some example embodiments do not require external measurement of the workpiece in a separate machine or in a LDI machine.

According to at least some example embodiments, the expected position of the die on the workpiece may be calculated based on input from the local alignment position of the die (e.g., translation, rotation, etc.) and the position of the local or global alignment mark(s). The actual position of the die on the workpiece may then be measured either immediately after the die is placed on the workpiece, after all dies are placed on the workpiece, or during placement of dies on the workpiece. The measurement may also be performed in a separate module in connection with the pick-and-place machine (e.g., in a machine having a unit arranged in-between, which also may be used for hardening of glue).

The position data may then be used to match a second layer to the first layer (e.g., by feeding the data into a LDI tool, another pick-and-place tool or via a creation tool having local alignment capability).

Figure 5:
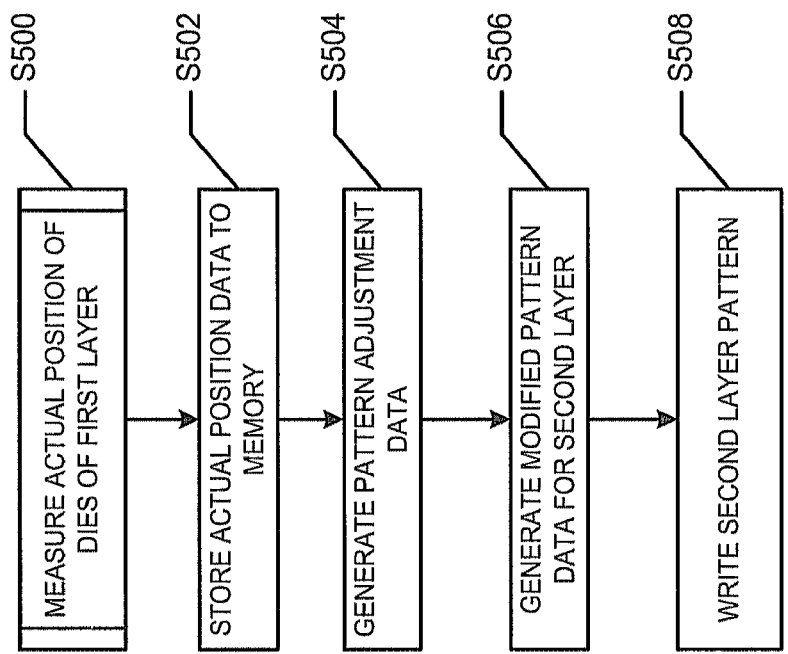
FIG. 5 is a flow chart illustrating an embedded multi-layer process according to an example embodiment.

FIG. 5 is a flow chart illustrating an example embodiment of a fan-out or embedded die process. As discussed above, in a fan-out or embedded die process a multi-layer structure is formed on a workpiece. In so doing, a second (or subsequent) structure (e.g., a conductor pattern or via hole pattern) must be aligned accurately with a first (or previous) structure (e.g., a layer of dies placed by the pick-and-place unit). The example embodiment shown in FIG. 5 may enable more accurate alignment of the second structure with the first structure on the workpiece.

Referring to FIGS. 3 and 5, after one or more dies D are placed on the workpiece W by the pick-and-place unit 2, the die placement system 14 measures the actual positions of the one or more dies D on the workpiece W at S500. In this example, the one or more dies D placed on the workpiece W constitute a first layer of the multi-layer structure to be formed on the workpiece W.

At S502, the position measurement controller 4 outputs the position data associated with the one or more dies D to the memory 20 in the same or substantially the same manner as discussed above with regard to S102 in FIG. 1A.

At S504, the image write controller 24 obtains (reads) the actual position data from the memory 20 and generates pattern adjustment data based on the actual position data obtained from the memory 20 as discussed above with regard to S104 in FIG. 1A.

At S506, the image write controller 24 generates modified pattern data based on the pattern adjustment data. In this example, the image write controller 24 generates modified pattern data for a second or subsequent layer of the multi-layer structure (e.g., a conductor pattern or via hole pattern) to be formed on the workpiece W. In this example, the first layer of the multi-layer structure is different from the second layer of the multi-layer structure. The modified pattern data is generated in the same or substantially the same manner as discussed above with regard to S106 in FIG. 1A.

At S508, the image writer 22 forms the second layer of the multi-layer structure by writing/generating/patterning a pattern on the workpiece W according to the modified pattern data. The pattern is written in the same or substantially the same manner as discussed above with regard to S108 in FIG. 1A.

Example embodiments may be utilized in a process where two or more dies are stacked on top of each other and where the top side of the first die is connected to the bottom side of the second die with relatively high alignment accuracy. If more dies are stacked in such a process, the top of the (n−1)-th die is connected to the bottom of the n-th die, where n is an integer larger the 2.

According to at least some example embodiments, the position of each die may be measured in the first die level and the measured information may then be fed to the pick-and-place machine that is performing the second die level placement, thereby relaxing the requirements for accuracy on the first pick-and-place machine, which in turn allows the first pick-and-place machine to operate at significantly higher speeds. As mentioned above, example embodiments described herein need not include an external measurement tool.

According to at least some example embodiments, the expected position of the die on the workpiece may be calculated based on input from the local alignment position of the die (e.g., translation, rotation, etc.) and the position of the local or global alignment mark(s). The actual position of the die on the workpiece may then be measured either directly after the die is placed on the workpiece, after all dies are placed on the workpiece, or during placement of dies on the workpiece. The measurement may also be performed in a separate module in connection with the pick-and-place machine (e.g., in a machine having a unit arranged in-between, which also may be used for hardening of glue).

The foregoing description of example embodiments has been provided for purposes of illustration and description. It is not intended to be exhaustive or to limit the disclosure. Individual elements or features of a particular embodiment are generally not limited to that particular example embodiment, but, where applicable, are interchangeable and can be used in a selected example embodiment, even if not specifically shown or described. The same may also be varied in many ways. Such variations are not to be regarded as a departure from the disclosure, and all such modifications are intended to be included within the scope of the disclosure.

What is claimed is:

1. A pattern generator comprising:
    a mounting head in a pick-and-place tool configured to pick and place at least one die on a workpiece, the mounting head including
        a die position determining unit configured to one of measure and detect an actual position of at least one die during a time between the placement of the at least one die on the workpiece and the picking up of a subsequent die for placement on the workpiece, the actual position of the at least one die being an actual position of the at least one die on the workpiece relative to at least one local alignment mark associated with or connected to a position on the workpiece;
    an image write controller configured to transform the actual position of the at least one die to a global alignment position, the global alignment position of the at least one die being a position of the at least one die relative to global alignment marks in a global coordinate system of the workpiece, the image write controller being further configured to generate adjusted pattern data by adjusting original pattern data associated with a pattern to be written on the workpiece based on the global alignment position of the at least one die; and
    an image writer configured to write the pattern on the workpiece according to the adjusted pattern data.

2. The pattern generator of claim 1, wherein the die position determining unit is configured to one of measure and detect the actual position of the at least one die while the mounting head is still in a position for placing the at least one die on the workpiece.

3. The pattern generator of claim 1, wherein the pick-and-place tool is configured to output position information indicative of the actual position of the at least one die, and wherein the position information includes a measurement of the actual position of the at least one die relative to the at least one local alignment mark.

4. The pattern generator of claim 3, wherein the at least one die is placed on a first layer, and the image write controller uses the position information to adjust original pattern data to be written on a second layer, which is different from the first layer.

5. The pattern generator of claim 4, wherein both the first layer and the second layer are layers associated with the same group of placed dies or components.

6. The pattern generator of claim 4, wherein the first layer is a layer associated with a first group of placed dies or components and the second layer is a layer associated with a second group of placed dies or components different from the first group of dies or components.

7. The pattern generator of claim 1, wherein the pick-and-place tool is configured to output position information indicative of the actual position of the at least one die to an external unit, either directly or indirectly via a memory, and wherein the position information is usable in the adjusting the original pattern data associated with the pattern to be written on the workpiece.

8. The pattern generator of claim 1, wherein the die position determining unit includes a camera configured to obtain an image of the workpiece.

9. The pattern generator of claim 8, wherein the camera is a charge coupled device camera.

10. The pattern generator of claim 8, wherein the camera is configured to obtain an image covering only a subarea of the workpiece surface area in order to measure the actual position of the at least one die on the workpiece relative to the at least one local alignment mark.

11. The pattern generator of claim 10, wherein the image obtained by the camera includes actual position information for only a subset of a plurality of dies placed on the workpiece.

12. The pattern generator of claim 11, wherein the subset of dies includes the at least one die placed in the last pick-and-place action performed by the mounting head.

13. The pattern generator of claim 1, wherein the die position determining unit includes a sensor configured to detect the actual position of the at least one die on the workpiece.

14. The pattern generator of claim 13, wherein the sensor is a laser sensor configured to use at least one of reflected light and triangulation to detect the actual position of the at least one die on the workpiece.

\* \* \* \* \*